(12) United States Patent
Wang et al.

(10) Patent No.: US 12,297,115 B2
(45) Date of Patent: May 13, 2025

(54) HIGH TEMPERATURE ATOMIC LAYER DEPOSITION OF SILICON-CONTAINING FILM

(71) Applicant: VERSUM MATERIALS US, LLC, Tempe, AZ (US)

(72) Inventors: Meiliang Wang, Shanghai (CN); Xinjian Lei, Vista, CA (US)

(73) Assignee: Versum Materials US, LLC, Tempe, AZ (US)

( * ) Notice: Subject to any disclaimer, the term of this patent is extended or adjusted under 35 U.S.C. 154(b) by 867 days.

(21) Appl. No.: 17/282,686

(22) PCT Filed: Oct. 4, 2019

(86) PCT No.: PCT/US2019/054650
§ 371 (c)(1),
(2) Date: Apr. 2, 2021

(87) PCT Pub. No.: WO2020/072874
PCT Pub. Date: Apr. 9, 2020

(65) Prior Publication Data
US 2021/0380418 A1  Dec. 9, 2021

Related U.S. Application Data

(60) Provisional application No. 62/742,056, filed on Oct. 5, 2018, provisional application No. 62/743,887, filed on Oct. 10, 2018.

(51) Int. Cl.
| | | |
|---|---|---|
| C01B 33/12 | (2006.01) | |
| C07F 7/08 | (2006.01) | |
| C23C 16/40 | (2006.01) | |
| C23C 16/44 | (2006.01) | |
| C23C 16/455 | (2006.01) | |

(52) U.S. Cl.
CPC .......... C01B 33/126 (2013.01); C07F 7/0896 (2013.01); C23C 16/401 (2013.01); C23C 16/4408 (2013.01); C23C 16/45553 (2013.01); *C01P 2002/85* (2013.01); *C01P 2006/10* (2013.01); *C01P 2006/80* (2013.01)

(58) Field of Classification Search
CPC .................................................. C23C 16/401
See application file for complete search history.

(56) References Cited

U.S. PATENT DOCUMENTS

| | | | |
|---|---|---|---|
| 7,659,357 B2 * | 2/2010 | Nakata | H01L 21/3122 528/10 |
| 2007/0275166 A1 | 11/2007 | Thridandam et al. | |
| 2013/0295779 A1* | 11/2013 | Chandra | H01L 21/0228 546/14 |
| 2016/0064219 A1 | 3/2016 | Yamamoto et al. | |
| 2016/0111272 A1 | 4/2016 | Girard et al. | |
| 2017/0207082 A1 | 7/2017 | Wang et al. | |
| 2018/0033614 A1* | 2/2018 | Chandra | C23C 16/308 |
| 2018/0127592 A1 | 5/2018 | Lei et al. | |

FOREIGN PATENT DOCUMENTS

| | | |
|---|---|---|
| CN | 106992114 A | 7/2017 |
| CN | 107923040 A | 4/2018 |
| EP | 2650399 A2 | 12/2013 |
| JP | 2013074237 A | 4/2013 |
| JP | 7256263 | 1/2022 |
| KR | 10-2017-0087425 | 8/2019 |
| WO | 2011/123369 A1 | 10/2011 |

* cited by examiner

*Primary Examiner* — Kelly M Gambetta
(74) *Attorney, Agent, or Firm* — David K. Benson; Versum Materials US, LLC

(57) ABSTRACT

A method and composition for depositing a silicon oxide film in an atomic layer deposition process at one or more temperatures of 600° C. or greater are provided. In one aspect, there is provided a method to deposit a silicon oxide film or material on a substrate in a reactor at one or more temperatures ranging from about 600° C. to 1000° C.; comprising the steps of: introducing into the reactor at least one halidocarbosilane precursor selected from the group of compounds having Formulae I and II described herein; purging the reactor with a purge gas; introducing an oxygen-containing source into the reactor; and purging the reactor with a purge gas; and wherein the steps are repeated until a desired thickness of silicon oxide is deposited.

11 Claims, No Drawings

HIGH TEMPERATURE ATOMIC LAYER DEPOSITION OF SILICON-CONTAINING FILM

This application claims priority to U.S. Provisional Application 62/742,056 filed Oct. 5, 2018. This application further claims priority to U.S. Provisional Application 62/743,887 filed Oct. 10, 2018.

FIELD OF THE INVENTION

Described herein is a composition and method for the formation of a silicon-containing film. More specifically, described herein is a composition and method for formation of a silicon oxide film at one or more deposition temperatures of about 600° C. or greater and using an atomic layer deposition (ALD) process.

BACKGROUND OF THE INVENTION

Thermal oxidation is a process commonly used to deposit high purity and highly conformal silicon oxide films such as silicon dioxide ($SiO_2$) in semiconductor applications. However, the thermal oxidation process has a very low deposition rate, e.g., less than 0.0007 Å/s at 700° C. (see B. E. Deal and A. S. Grove "General Relationship for the Thermal Oxidation of Silicon." Journal of Applied Physics Vol 36, page 3770 (1965)) which makes it impractical for high volume manufacturing processes to be commercially adopted.

Atomic Layer Deposition (ALD) and Plasma Enhanced Atomic Layer Deposition (PEALD) are processes used to deposit silicon dioxide ($SiO_2$) conformal film at low temperatures (<500° C.). In both ALD and PEALD processes, the precursor and reactive gases (such as oxygen or ozone) are separately pulsed in certain number of cycles to form a monolayer of silicon dioxide ($SiO_2$) with each cycle. However, silicon dioxide ($SiO_2$) deposited at low temperatures using these processes may contain levels of impurities such as hydrogen (H), carbon (C), nitrogen (N), or combinations of such which are detrimental to semiconductor applications. To remedy this, one possible solution would be to increase the deposition temperature to a temperature greater than 500° C. However, at these higher temperatures, conventional precursors employed by semiconductor industries tend to self-react, thermally decompose, and deposit in chemical vapor deposition (CVD) mode rather than ALD mode. The CVD mode deposition has reduced conformality compared to ALD deposition, especially for semiconductor applications that have high aspect ratio structures such as NAND and V-NAND. In addition, the CVD mode deposition process imparts less control of film or material thickness than does the ALD mode deposition.

US Publ. No. 2014/0170858 describes a method of forming a film including a predetermined element, oxygen and at least one element selected from a group consisting of nitrogen, carbon and boron on a substrate by performing a cycle a predetermined number of times, the cycle including supplying a source gas to the substrate wherein the source gas contains the predetermined element, chlorine and oxygen with a chemical bond of the predetermined element and oxygen, and supplying a reactive gas to the substrate wherein the reactive gas contains the at least one element selected from the group consisting of nitrogen, carbon and boron.

US Publ. No. 2007/0111545 describes a method of forming silicon dioxide layers using ALD to enhance deposition rate and improve step coverage in semiconductor device fabrication.

U.S. Pat. No. 7,498,273 describes a method of depositing a low-K dielectric layer in a gap formed on a substrate are described using siloxanes in PECVD which give films with low porosity, high etching selectivity, and fewer cracks. The methods include introducing an organo-Si precursor and an O precursor to a deposition chamber. The organo-Si precursor has a C:Si atom ratio of <8, and the O precursor comprises atomic O that is generated outside the deposition chamber.

U.S. Pat. No. 7,084,076 describes a method for forming a silicon dioxide film using atomic layer deposition (ALD), wherein a halogen- or NCO-substituted siloxane is used as a Si source.

US Publ. No. 2013/0295779 describes a composition and ALD for forming a silicon oxide containing film at one or more depositions temperatures of about 500° C. or greater.

The previously identified patents and patent applications are hereby incorporated by reference.

Thus, there is a need to develop a process for forming a high quality, low impurity, high conformal silicon oxide film using an atomic layer deposition (ALD) process or an ALD-like process, such as without limitation a cyclic chemical vapor deposition process, to replace thermal-based deposition processes at temperatures above 600° C. for Vertical NAND (V-NAND) memory technology. Further, it may be desirable to develop a high temperature deposition (e.g., deposition at one or more temperatures of 600° C. or higher) to improve one or more film properties, such as purity and/or density, in an ALD or ALD-like process for the fabrication of V-NAND memory.

BRIEF SUMMARY OF THE INVENTION

Described herein is a method for the deposition of a silicon oxide material or film at high temperatures, e.g., at one or more temperatures of about 600° C. or greater, in an atomic layer deposition (ALD) or an ALD-like process. The silicon oxide films deposited using the composition or method described herein comprise at least one or more of the following attributes: a density of about 2.1 g/cm³ or greater; Wet Etching Rate (WER) in 0.5 wt. % dHF about 6 or less, preferably about 4 or less, most preferably about 3 or less relative to thermal oxide; a carbon content is $2 \times 10^{19}$ atoms/cm³ or less measured by Secondary Ion Mass Spectrometry (SIMS).

In one aspect, there is provided a process to deposit a silicon oxide film or material comprising the steps of:
 a. providing a substrate in a reactor and heating up the substrate to a desired temperature;
 b. introducing into the reactor at least one halidocarbosilane precursor selected from the group of compounds having the following Formulae I and II:

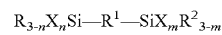

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl)methylene, (dimethyl)methylene and (ethyl)methylene; $R^3$ is selected from hydrogen and a $C_1$ to $C_3$ alkyl group; n=1, 2, or 3; m=0, 1, 2 or 3; p=0, 1 or 2, q=0, 1, or 2, and p+q=2;

c. purging the reactor with a purge gas;
 d. introducing an oxygen-containing source into the reactor; and e. purging reactor with a purge gas;
where steps b through e are repeated until a desired thickness of silicon oxide is deposited; and wherein the process is conducted at one or more temperatures ranging from about 600 to 850° C. In this or other embodiments, the method is conducted at one or more pressures ranging from about 50 milliTorr (mTorr) to about 760 Torr. In this or other embodiments, the oxygen-containing source is at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen (i.e. nitrous oxide $N_2O$ or nitric oxide, NO), water vapor, water vapor plasma, a composition comprising water and ozone, hydrogen peroxide, ozone source, and combinations thereof.

In another aspect, there is provided a process to deposit a silicon oxide film or material comprising the steps of:
a. providing a substrate in a reactor and heating up the substrate to a desired temperature;
b. introducing into the reactor at least one halidocarbosilane precursor selected from the group of compounds having the following Formulae I and II:

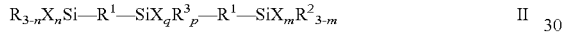

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl)methylene, (dimethyl)methylene and (ethyl)methylene; $R^3$ is selected from hydrogen and a $C_1$ to $C_3$ alkyl group; n=1, 2, or 3; m=0, 1, 2 or 3; p=0, 1 or 2, q=0, 1, or 2, and p+q=2;
c. purging the reactor with a purge gas;
d. introducing an oxygen-containing source into the reactor;
e. purging reactor with a purge gas;
f. introducing water vapor or hydroxyl source into the reactor; and
g. purging the reactor with a purge gas;
where steps b through g are repeated until a desired thickness of silicon oxide is deposited; and wherein the process is conducted at one or more temperatures ranging from 600 to 850° C.

In one or more embodiments of the process described above, the process is conducted at one or more pressures ranging from about 50 milliTorr (mTorr) to about 760 Torr.

In one or more embodiments of the process described above, the purge gas is selected from the group consisting of nitrogen, helium, argon and combinations thereof.

In one or more embodiments of the process described above, the oxygen-containing source comprises at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen (i.e. nitrous oxide $N_2O$ or nitric oxide, NO), water vapor, water vapor plasma, a composition comprising water and ozone, hydrogen peroxide, ozone source, and combinations thereof.

In a further aspect, there are provided a composition for depositing a silicon oxide film comprising at least one halidocarbosilane precursor selected from the group of compounds having the following Formulae I and II:

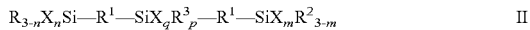

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl)methylene, (dimethyl)methylene and (ethyl)methylene; $R^3$ is selected from hydrogen and a $C_1$ to $C_3$ alkyl group; n=1, 2, or 3; m=0, 1, 2 or 3; p=0, 1 or 2, q=0, 1, or 2, and p+q=2. Examples of these halidocarbosilane precursors are shown in the following Table I:

TABLE I

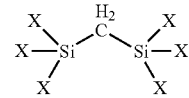

1,1,1,3,3,3-hexahalido-1,3-disilapropane

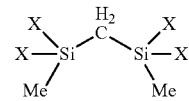

2,2,4,4-tetrahalido-2,4-disilapentane

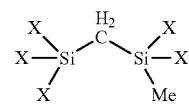

1,1,1,3,3-pentahalido-1,3-disilabutane

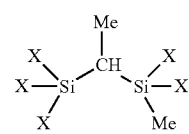

1,1,1,3,3-pentahalido-2-methyl-1,3-disilabutane

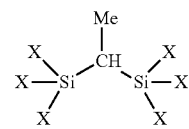

1,1,1,3,3-hexahalido-2-methyl-1,3-disilapropane

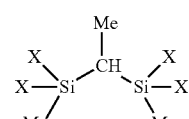

2,2,4,4-tetrahalido-3-methyl-2,4-disilapentane

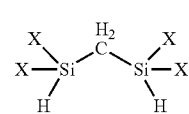

1,1,3,3-tetrahalido-1,3-disilapropane

TABLE I-continued

2,4-dihalido-2,4-dimethyl-2,4-disilapentane

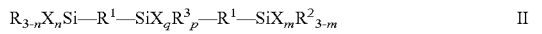

1,1,1,3,3,5,5,5-octahalido-1,3,5-trisilapentane

2,2,4,6,6-pentahalido-4-methyl-2,4,6-trisilaheptane

One embodiment of the invention relates to a composition for use in depositing a silicon containing film comprising at least one halidocarbosilane precursor selected from the group of compounds having the following Formulae I and II:

$$R_{3-n}X_nSi-R^1-SiX_mR^2_{3-m} \quad \text{I}$$

$$R_{3-n}X_nSi-R^1-SiX_qR^3_p-R^1-SiX_mR^2_{3-m} \quad \text{II}$$

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl)methylene, (dimethyl)methylene and (ethyl)methylene; $R^3$ is selected from hydrogen and a $C_1$ to $C_3$ alkyl group; n=1, 2, or 3; m=0, 1, 2 or 3; p=0, 1 or 2, q=0, 1, or 2, and p+q=2.

Another embodiment of the invention relates to a silicon containing film produced by any of the foregoing methods. A further embodiment of the invention relates to a silicon containing film having a density of about 2.1 g/cm³ or greater; Wet Etching Rate (WER) in 0.5 wt. % dHF about 6 or less relative to thermal oxide; a carbon content is $2\times10^{19}$ atoms/cm³ or less.

The various aspects and embodiments of the invention can be used alone or in combinations with each other.

DETAILED DESCRIPTION OF THE INVENTION

Described herein are a method and composition for forming a silicon oxide film. The term silicon oxide film or material includes, without limitation, a stoichiometric or non-stoichiometric silicon oxide film, a silicon oxynitride film, a silicon oxycarbide film, a silicon oxycarbonitride film, and combinations thereof. In one particular embodiment, the silicon oxide film is deposited at one or more temperatures of about 600° C. or greater in an atomic layer deposition (ALD) or in an ALD-like deposition process, such as without limitation a cyclic chemical vapor deposition process (CCVD). Throughout the description, the term "ALD or ALD-like" denotes to a process including, but not limited to, the following processes: a) each reactant including halidosilane precursor and reactive gas is introduced sequentially into a reactor such as a single wafer ALD reactor, semi-batch ALD reactor, or batch furnace ALD reactor; b) each reactant including halidosilane precursor and reactive gas is exposed to a substrate by moving or rotating the substrate to different sections of the reactor and each section is separated by inert gas curtain, i.e. spatial ALD reactor or roll to roll ALD reactor. Throughout the description, the term "$C_1$ linker" refers to one carbon atom bonded to two silicon atoms such as Si—$CH_2$—Si (i.e. C1 linker is methylene) or Si—CH(Me)-Si (i.e. C1 linker is (methyl)methylene), or Si—$CMe_2$-Si (i.e. C1 linker is (dimethyl)methylene), or Si—CH(Et)-Si (i.e. C1 linker is (ethyl) methylene).

The method described herein uses at least one halidocarbosilane precursor and an oxygen-containing source in a cyclical process at one or more deposition temperatures ranging from about 600° C. to about 950° C. or from about 650° C. to about 750° C. or from about one 700 to 850° C. to provide a silicon oxide film. In one embodiment of the deposition process described herein, the process comprises the following steps:

a. providing a substrate in a reactor and heating up the substrate to a desired temperature;
b. introducing into the reactor at least one halidocarbosilane precursor selected from the group of compounds having the following Formulae I and II:

$$R_{3-n}X_nSi-R^1-SiX_mR^2_{3-m} \quad \text{I}$$

$$R_{3-n}X_nSi-R^1-SiX_qR^3_p-R^1-SiX_mR^2_{3-m} \quad \text{II}$$

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl)methylene, (dimethyl)methylene and (ethyl)methylene; $R^3$ is selected from hydrogen and a $C_1$ to $C_3$ alkyl group; n=1, 2, or 3; m=0, 1, 2 or 3; p=0, 1 or 2, q=0, 1, or 2, and p+q=2;

c. purging the reactor with a purge gas;
d. introducing an oxygen-containing source into the reactor; and
e. purging the reactor with a purge gas.

wherein steps b through e are repeated until a desired thickness of the silicon oxide film is deposited on at least a surface of the substrate.

While not wishing to be bound by theory or explanation, it is believed that the at least one halidocarbosilane precursor described herein should have at least one anchoring functionality as well as pre-existing Si—C—Si linkage (i.e. $C_1$ linker), which reacts with certain reactive sites on the substrate surface to anchor a monolayer of Si—C—Si species which may function as barrier layer to prevent any unwanted interaction between the oxygen-containing source and the substrate, especially during formation of the first few layers of silicon oxide as compared to conventional silicon precursors having only one silicon atom such as silicon tetrachloride or dimethylaminotrimethylsilane The anchoring functionalities can be selected from a halide (Cl, Br, I) group. The passivating functionality is selected from an alkyl, preferably methyl. The remaining groups on the surface can then be oxidized to form more Si—O—Si linkages as well as hydroxyl groups. In addition, hydroxyl sources such as $H_2O$ or water plasma can also be introduced into the reactor to form more hydroxyl groups as reactive sites for the next ALD cycle.

As previously mentioned, there are provided a composition for depositing a silicon oxide film comprising at least one halidocarbosilane precursor selected from the group of compounds having the following Formulae I and II:

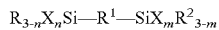
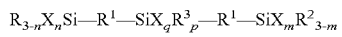

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl)methylene, (dimethyl)methylene and (ethyl)methylene; $R^3$ is selected from hydrogen and a $C_1$ to $C_3$ alkyl group; n=1, 2, or 3; m=0, 1, 2 or 3; p=0, 1 or 2, q=0, 1, or 2, and p+q=2. Examples of precursors having Formulae I or II include are but not limited to: 1,1,1,3,3,3-hexachlorodisilapropane, 1,1,1,3,3-pentahalido-1,3-disilabutane, 1,1,1,3,3,3-hexachloro-2-methyl-1,3-disilapropane, 1,1,1,3,3-pentahalido-2-methyl-1,3-disilabutane, 2,2,4,4-tetrachloro-2,4-disilapentane, 1,1,3,3-tetrachloro-1,3-disilapropane, 2,4-dichloro-2,4-dimethyl-2,4-disilapentane, 1,1,1,3,3,5,5,5-octachloro-1,3,5-trisilapentane, 2,2,4,6,6-pentachloro-2,4,6-trimethyl-2,4,6-trisilaheptane and mixtures thereof.

In one particular embodiment, the halidocarbosilane precursors are comprised of at least one anchoring functionality (e.g., Si—Cl) and at least one passivating functionality (e.g., Si-Me where Me is a methyl group). Examples of such precursors are provided in the following Table II:

TABLE II

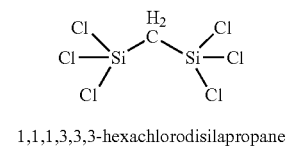

1,1,1,3,3,3-hexachlorodisilapropane

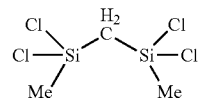

2,2,4,4-tetrachloro-2,4-disilapentane

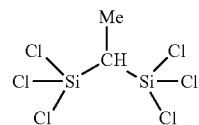

1,1,1,3,3,3-hexachloro-2-methyl-1,3-disilapropane

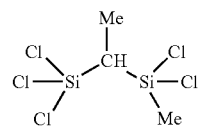

1,1,1,3,3-pentachloro-2-methyl-1,3-disilabutane

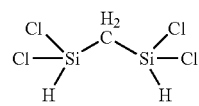

1,1,3,3-tetrachloro-1,3-disilapropane

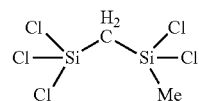

TABLE II-continued 1,1,1,3,3-pentahalido-1,3-disilabutane

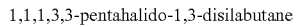

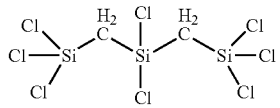

1,1,1,3,3,5,5,5-octachloro-1,3,5-trisilapentane

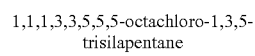

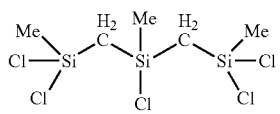

2,2,4,6,6-pentachloro-4-methyl-2,4,6-trisilaheptane

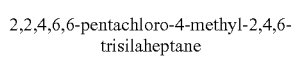

In certain embodiments, the silicon oxide films deposited using the methods described herein are formed in the presence of oxygen using an oxygen-containing source, reagent or precursor comprising oxygen. An oxygen-containing source may be introduced into the reactor in the form of at least one oxygen-containing source gas and/or may be present incidentally in the other precursors used in the deposition process. Suitable oxygen-containing source gases may include, for example, oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen (i.e. nitrous oxide $N_2O$ or nitric oxide, NO), water vapor, water vapor plasma, a composition comprising water and ozone, hydrogen peroxide, ozone source, and combinations thereof. In certain embodiments, the oxygen-containing source comprises an oxygen-containing source gas that is introduced into the reactor at a flow rate ranging from about 1 to about 10000 standard cubic centimeters (sccm) or about 1 to about 2000 standard cubic centimeters (sccm) or from about 1 to about 1000 sccm. The oxygen-containing source can be introduced for a time that ranges from about 0.1 to about 100 seconds. In one particular embodiment, the oxygen-containing source comprises water having a temperature of 10° C. or greater. In embodiments wherein the film is deposited by an ALD or a cyclic CVD process, the precursor pulse can have a pulse duration that is greater than 0.01 seconds, and the oxygen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In certain embodiments, the silicon oxide films further comprise nitrogen. In these embodiments, the films are deposited using the methods described herein and formed in the presence of nitrogen-containing source. A nitrogen-containing source may be introduced into the reactor in the form of at least one nitrogen source gas and/or may be present incidentally in the other precursors used in the deposition process. Suitable nitrogen-containing source gases may include, for example, ammonia, hydrazine, monoalkylhydrazine, dialkylhydrazine, nitrogen, nitrogen/ hydrogen, ammonia plasma, nitrogen plasma, nitrogen/hydrogen plasma, and mixture thereof. In certain embodiments, the nitrogen-containing source comprises an ammonia plasma or hydrogen/nitrogen plasma source gas that is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 6000 sccm for about 0.1 to 1000 seconds, thereby purging the unreacted material and any byproduct that may remain in the reactor.

The respective steps of supplying the precursors, oxygen-containing source, the nitrogen-containing source, and/or other precursors, source gases, and/or reagents may be performed by changing the time for supplying them to change the stoichiometric composition of the resulting dielectric film.

The purge gas can combine with residual gas from a previous step to form a composition. For example, the composition can comprise the purge gas and at least one of the inventive precursors. The purge gas will comprise about 1% to about 95% of this composition.

Energy is applied to the at least one of the halidocarbosilane precursor, the oxygen-containing source, the nitrogen-containing source, or combinations thereof to induce reaction and to form a silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The at least one halidocarbosilane precursor may be delivered to the reaction chamber such as a cyclic CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In one embodiment of the method described herein, a cyclic deposition process such as ALD-like, ALD, or PEALD may be used wherein the deposition is conducted using the at least one halidocarbosilane precursor and an oxygen-containing source. The ALD-like process is defined as a cyclic CVD process but still provides high conformal silicon oxide films.

In certain embodiments, the gas lines connecting from the precursor canisters to the reaction chamber are heated to one or more temperatures depending upon the process requirements and the container of the at least one halidocarbosilane precursor is kept at one or more temperatures for bubbling. In other embodiments, a solution comprising the at least one halidocarbosilane is injected into a vaporizer kept at one or more temperatures for direct liquid injection.

A flow of argon and/or other gas may be employed as a carrier gas to help deliver the vapor of the at least halidocarbosilane to the reaction chamber during the precursor pulsing. In certain embodiments, the reaction chamber process pressure is about 1 Torr.

In a typical ALD or an ALD-like process such as a CCVD process, the substrate such as a silicon oxide substrate is heated on a heater stage in a reaction chamber that is exposed to the silicon precursor initially to allow the complex to chemically adsorb onto the surface of the substrate.

A purge gas, such as argon, purges away unabsorbed excess complex from the process chamber. After sufficient purging, an oxygen-containing source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

The inventive ALD process can achieve a film growth rate that can range from about 0.5 Å/cycle to about 4 Å/cycle, about 0.8 Å/cycle to about 3.5 Å/cycle and in some preferable cases about 1 Å/cycle to about 3.5 Å/cycle. The refractive index (RI) of the deposited film can range from about 1.35 to about 1.55, about 1.40 to about 1.50 and in some cases about 1.44 to about 1.48. The diluted HF (about 0.5 wt. % HF in deionized water) relative etch rate of the deposited films to thermal oxide can range from about 0.5 to about 8.0, about 1.0 to about 6.0 and in some preferable cases about 1.0 to about 4.0.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen-containing source gases may be performed by varying the duration of the time for supplying them to change the stoichiometric composition of the resulting dielectric film. The dielectric constant (k) of the deposited film can range from about 3.0 to about 6.0, about 3.5 to about 5.0 and in some preferable cases about 3.8 to about 4.2.

One particular embodiment of the process described herein to deposit a silicon oxide film on a substrate at one or more deposition temperatures of about 600 or greater comprises the following steps:
a. providing a substrate in a reactor and heating up the substrate to a desired temperature;
b. introducing into the reactor at least one halidocarbosilane precursor having Formulae I and II:

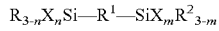  I

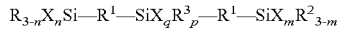  II wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl)methylene, (dimethyl)methylene and (ethyl)methylene; $R^3$ is selected from hydrogen and a $C_1$ to $C_3$ alkyl group; n=1, 2, or 3; m=0,1, 2 or 3; p=0, 1 or 2, q=0, 1, or 2, and p+q=2;
c. purging the reactor with a purge gas;
d. introducing an oxygen-containing source into the reactor; and
e. purging the reactor with a purge gas
wherein steps b through e are repeated until a desired thickness of the silicon oxide film is deposited.

Another embodiment of the process described herein introduces an oxygen-containing source comprising a hydroxyl (e.g., OH fragments formed during the deposition process) such as $H_2O$ vapor or $H_2O$ plasma after the oxygen-containing sources being introduced into the reactor. In this embodiment, it is believed that the hydroxyl groups repopulate the surface to create reactive sites for the halidocarbosilane precursor which anchor on the surface to form the monolayer. The deposition steps are comprised of:
a. providing a substrate in a reactor and heating up the substrate to a desired temperature;
b. introducing into the reactor at least one halidocarbosilane having Formulae I or described above;
c. purging the reactor with a purge gas;
d. introducing an oxygen-containing source comprising at least one selected from water, hydrogen peroxide, and a plasma comprising water into the reactor;
e. purging the reactor with a purge gas;
f. introducing an oxygen-containing source into the reactor; and
g. purging the reactor with a purge gas
wherein steps b through g are repeated until a desired thickness of a silicon oxide film is deposited.

In an alternative embodiment of the process described herein, the deposition steps are comprised of:
a. providing a substrate in a reactor and heating up the substrate to a desired temperature;
b. introducing into the reactor at least one halidocarbosilane precursor having Formulae I or II described herein;
c. purging the reactor with a purge gas;
d. introducing an oxygen-containing source into the reactor;
e. purging the reactor with a purge gas;
f. introducing an OH-containing source into the reactor; and g. purging the reactor with a purge gas
wherein steps b through g are repeated until a desired thickness of a silicon oxide film is deposited.

Yet another embodiment employs hydrogen peroxide, ozone, a composition comprising hydrogen and oxygen, or oxygen plasma to remove a passivating functionality or group such as methyl or chlorine. The deposition steps are as follows:
a. providing a substrate in a reactor and heating up the substrate to a desired temperature;
b. introducing into the reactor at least one halidocarbosilane precursor having Formulae I or described herein;
c. purging the reactor with a purge gas;
d. introducing a source comprising at least one selected from ozone, hydrogen peroxide, a composition comprising hydrogen and oxygen, and oxygen plasma into the reactor; and
e. purging the reactor with a purge gas,
wherein steps b through e are repeated until a desired thickness of a silicon oxide film is deposited.

In the process described herein, the one or more deposition temperature ranges from any one or more of the following endpoints: 600, 650, 675, 600, 700, 725, 750, 775, 800, 825, 850, 875, 900, 925, 950, 975, or 1000° C. In certain embodiments, the at least one deposition temperature ranges from about 600° C. to about 1000° C.; or from about 600° C. to about 750° C.; or from about 700° C. to about 850° C.; or from about 750° C. to about 850° C.

Throughout the description, the term "step coverage" as used herein is defined as a percentage of two thicknesses of the deposited silicon-containing film in a structured or featured substrate having either vias or trenches or both, with bottom step coverage being the ratio (in %):thickness at the bottom of the feature is divided by thickness at the top of the feature, and middle step coverage being the ratio (in %):thickness on a sidewall of the feature is divided by thickness at the top of the feature. Films deposited using the process described herein exhibit a step coverage of about 60% or greater, about 70% or greater, about 80% or greater, or about 90% or greater which indicates that the films are conformal.

Throughout the description, term "hydroxyl containing source" as used herein refers to an oxygen-containing source having hydroxyl groups. Examples include, but not limited to, water, water plasma, a composition comprising hydrogen and oxygen, a composition comprising hydrogen and ozone, a composition comprising water and oxygen, a composition comprising water and carbon dioxide, a composition comprising water and oxygen, a composition comprising water and ozone, a composition comprising water and nitrous oxide, a composition comprising water and nitric oxide, hydrogen peroxide ($H_2O_2$), a plasma generated from hydrogen and oxygen, and combinations thereof.

Deposition pressure are at one or more pressures ranging from 50 millitorr (mT) to 760 Torr, or from 500 mT-100 Torr.

In one particular embodiment, the process described herein is conducted substantially free of a catalyst, such as an organoamine (e.g., pyridine, trimethylamine, see U.S. Pat. No. 7,084,076; hereby incorporated by reference). In this or another embodiment, the process described herein is conducted without requiring one or more annealing step.

The following Examples are provided to illustrate certain embodiments of the invention and shall not limit the scope of the appended claims.

Working Examples

Comparable Example 1a: Atomic Layer Deposition of Silicon Oxide Films with Silicon Tetrachloride Atomic layer deposition of silicon oxide films were conducted using the precursorsilicon tetrachloride ($SiCl_4$). The depositions were performed on a laboratory scale ALD processing tool. The silicon precursor was delivered to the chamber by vapor draw. All gases (e.g., purge and reactant gas or precursor and oxygen-containing source) were preheated to 100° C. prior to entering the deposition chamber. Gases and precursor flow rates were controlled with ALD diaphragm valves with high speed actuation. The substrates used in the deposition were 12-inch long silicon strips. A thermocouple was attached on the sample holder to confirm substrate temperature. Depositions were performed using ozone as oxygen-containing source gas. Deposition parameters are provided in Table III, wherein the term pulse or dose is interchangeable, standing for the step of introducing silicon precursor or oxygen-containing source into the reactor.

TABLE III

Process for Atomic Layer Deposition of Silicon Oxide Films with Oxygen Source Using $SiCl_4$

| | | |
|---|---|---|
| a | 6 sec Evacuate reactor and heat up a substrate to a desired temperature | Reactor pressure < 100 mT |
| b | 12 sec Dose silicon precursor | Reactor pressure typically < 2 Torr |
| c | 6 sec Purge reactor with nitrogen | Flow 1.5 slpm $N_2$ and Evacuate reactor to < 100 mtorr |
| d | 10 sec Dose oxygen-containing source ozone | |
| e | 6 sec Purge reactor with nitrogen | Flow 1.5 slpm $N_2$ and Evacuate reactor to < 100 mtorr |

Steps b to e were repeated until a desired thickness was reached. Thickness and Refractive Indices (RI) of the films were measured using a FilmTek 2000SE ellipsometer by fitting the reflection data from the film to a pre-set physical model (e.g., the Lorentz Oscillator model). Wet etch rate was performed using 1% solution of 49% hydrofluoric (HF) acid in deionized water (about 0.5 wt. % HF). Thermal oxide wafers were used as reference for each batch to confirm solution concentration. A typical thermal oxide wafer Wet Etch Rate (WER) for 0.5 wt. % HF in deionized water solution is 0.5 Å/s. The film thickness before and after etch was used to calculate wet etch rate. Table IV summarizes $SiO_2$ film properties deposited with a 12 seconds precursor exposure of the $SiCl_4$ precursor with ozone as oxygen-containing source at wafer temperature of 800° C. Growth rate or growth per cycle (GPC) is defined as the thickness of silicon oxide in angstrom (Å) divided by the number of cycles.

TABLE IV

Silicon Oxide Film Properties Deposited with $SiCl_4$ and Ozone as Oxygen Source

| Wafer Temperature (Celsius) | Oxygen-Containing Source | Growth Rate (Å/cycle) | RI |
|---|---|---|---|
| 800 | ozone | 0.53 | 1.49 |

Comparable Example 1b: Atomic Layer Deposition of Silicon Oxide Films with Hexachlorodisiloxane at Substrate Temperature Higher than 600° C.

Atomic layer deposition of silicon oxide films were conducted with silicon hexachlorodisiloxane (HCDSO) with ozone as oxygen-containing source gas using steps listed in Table III of Comparable Example 1a. Table V summarizes deposition conditions and physical properties of silicon oxide deposited at temperatures ranging from 700° C. to 800° C., demonstrating that HCDSO has a much higher growth rate than $SiCl_4$ under similar ALD conditions

TABLE V

Deposition Rate and Film Properties of Silicon Oxide Films Deposited with HCDSO and Ozone Process

| Wafer Temperature (Celsius) | Oxygen-Containing source | Growth Rate (Å/cycle) | Relative WER to Thermal oxide | RI |
|---|---|---|---|---|
| 800 | Ozone | 1.18 | 1.81 | 1.46 |
| 750 | Ozone | 1.09 | 2.92 | 1.46 |
| 700 | Ozone | 0.84 | 4.95 | 1.46 |

Example 2: Atomic Layer Deposition of Silicon Oxide Films with 1,1,1,3,3,3-Hexachlorodisilapropane at Substrate Temperature Higher than 600° C.

Atomic layer deposition of silicon oxide films were conducted with silicon 1,1,1,3,3,3-hexachlorodisilapropane and with ozone as the oxygen-containing source using steps listed in Table III of comparable Example 1a. Table VI summarizes deposition conditions and physical properties of silicon oxide deposited at temperatures ranging from 700° C. to 800° C., demonstrating that 1,1,1,3,3,3-hexachlorodisilapropane has a much higher growth rate than $SiCl_4$ and HCDSO under similar ALD conditions. Table VI also shows the relative WER to thermal oxide for the silicon oxide film deposited at various substrate temperatures with 1,1,1,3,3,3-hexachlorodisilapropane and ozone, demonstrating that the higher the temperature, the lower the WER.

TABLE VI

Deposition Rate and Film Properties of Silicon Oxide Films Deposited with 1,1,1,3,3,3-hexachlorodisilapropane and Ozone

| Wafer Temperature (Celsius) | Reactant | Growth Rate (Å/cycle) | Relative WER to Thermal oxide | RI |
|---|---|---|---|---|
| 800 | Ozone | 1.60 | 1.87 | 1.45 |
| 750 | Ozone | 1.31 | 2.10 | 1.44 |
| 700 | Ozone | 1.08 | 3.73 | 1.44 |

The film impurities were analyzed by Secondary Ion Mass Spectrometry (SIMS) and film impurities are shown in Table VII. The film shows low C, N and chlorine impurities.

TABLE VII

Film Impurities of Silicon Oxide Films Deposited with
1,1,1,3,3,3-hexachlorodisilapropane, and Ozone

| Wafer Temperature (°C.) | Ozone Time (seconds) | C (atom/cm³) | H (atom/cm³) | N (atom/cm³) | Cl (atom/cm³) |
|---|---|---|---|---|---|
| 750 | 10 | 6.25E+18 | 1.38E+20 | 2.97E+17 | 6.57E+17 |
| 800 | 10 | 7.08E+18 | 1.14E+20 | 3.01E+17 | 6.04E+17 |

While the invention has been described with reference to certain preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments, but that the invention will include all embodiments falling within the scope of the appended claims.

The invention claimed is:

1. A method to deposit a silicon oxide film, the method comprising the steps of:
   a. providing a substrate comprising a surface in a reactor and heating the reactor to a temperature ranging from about 600° C. to about 1000° C.
   b. introducing into the reactor at least one halidocarbosilane precursor selected from the group of compounds having the following Formulae I and II:

$$R_{3-n}X_nSi-R^1-SiX_mR^2_{3-m} \qquad \text{I}$$

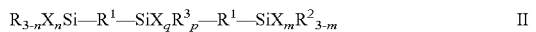

$$R_{3-n}X_nSi-R^1-SiX_qR^3_p-R^1-SiX_mR^2_{3-m} \qquad \text{II}$$

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl) methylene, (dimethyl) methylene and (ethyl) methylene; $R^3$ is selected from hydrogen and a $C_1$ to $C_3$ alkyl group; n=1, 2, or 3; m=0,1, 2 or 3; p=0, 1 or 2, q=0, 1, or 2, and p+q=2, wherein the at least one halidocarbosilane precursor reacts on at least a portion of the surface of the substrate to provide a chemisorbed layer;
   c. purging the reactor of any unconsumed precursors and/or reaction by-products from step b with a first purge gas;
   d. introducing an oxygen-containing source into the reactor to react with the chemisorbed film to form a silicon oxide film; and
   e. purging the reactor of any unconsumed oxygen-containing source and/or reaction by-products from step d with a second purge gas which is the same as or different from the first purge gas; and
   wherein steps b through e are repeated until a desired thickness of the silicon oxide film is deposited, wherein the silicon oxide film has a carbon content in an amount of less than 5 at. % as measured by X-Ray Photoelectron Spectroscopy (XPS).

2. The method of claim 1, wherein the at least one halidocarbosilane precursor is selected from the group consisting of: 1,1,1,3,3,3-hexachlorodisilapropane, 1,1,1,3,3-pentahalido-1,3-disilabutane, 1,1,1,3,3,3-hexachloro-2-methyl-1,3-disilapropane, 1,1, 1,3,3-pentahalido-2-methyl-1,3-disilabutane, 2,2,4,4-tetrachloro-2,4-disilapentane, 1,1,3,3-tetrachloro-1,3-disilapropane, 2,4-dichloro-2,4-dimethyl-2,4-disilapentane, 1,1,1,3,3,5,5,5-octachloro-1,3,5-trisilapentane, 2,2,4,6,6-pentachloro-4-methyl-2,4,6-trisilaheptane, and mixtures thereof.

3. The method of claim 1, wherein each of the first and second purge gases is selected from the group consisting of nitrogen, helium, argon, and combinations thereof.

4. The method of claim 1, wherein the oxygen-containing source comprises at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen, water vapor, water vapor plasma, a composition comprising water and ozone, hydrogen peroxide, ozone source, and combinations thereof.

5. A method to deposit a silicon oxide film comprising the steps of:
   a. providing a substrate in a reactor and heating the reactor to a temperature ranging from about 600° C. to about 1000° C.;
   b. introducing into the reactor at least one halidocarbosilane precursor selected from the group of compounds having the following Formulae I and II:

$$R_{3-n}X_nSi-R^1-SiX_mR^2_{3-m} \qquad \text{I}$$

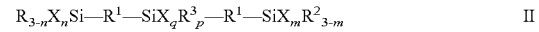

$$R_{3-n}X_nSi-R^1-SiX_qR^3_p-R^1-SiX_mR^2_{3-m} \qquad \text{II}$$

wherein X=Cl, Br, or I; R and $R^2$ are each independently selected from a hydrogen atom, and a $C_1$ to $C_3$ alkyl group; $R^1$ is a $C_1$ linker bonded to two silicon atoms and selected from methylene, (methyl) methylene, (dimethyl) methylene and (ethyl) methylene; $R^3$ is selected from hydrogen and a $C_1$ to $C_3$ alkyl group; n=1, 2, or 3; m=0, 1, 2 or 3; p=0, 1 or 2, q=0, 1, or 2, and p+q=2 to form a layer on the substrate;
   c. purging the reactor of any unconsumed precursors and/or reaction by-products from step b with a first purge gas;
   d. introducing an oxygen-containing source into the reactor to react with the layer to form a silicon oxide film;
   e. purging the reactor of any unconsumed oxygen-containing source and/or reaction by-products from step d with a second purge gas which is the same as or different from the first purge gas;
   f. introducing a hydroxyl containing source into the reactor to react with the silicon oxide film;
   g. purging the reactor with a purge gas to remove any unreacted hydroxyl containing source and/or any reaction by-products; and
   wherein steps b through g are repeated until a desired thickness of the silicon oxide film is formed, wherein the silicon oxide film has a carbon content in an amount of less than 5 at. % as measured by X-Ray Photoelectron Spectroscopy (XPS).

6. The method of claim 5, wherein the at least one halidocarbosilane precursor is selected from the group consisting of: 1,1, 1,3,3,3-hexachlorodisilapropane, 1,1,1,3,3-pentahalido-1,3-disilabutane, 1,1,1,3,3,3-hexachloro-2-methyl-1,3-disilapropane, 1,1,1,3,3-pentahalido-2-methyl-1,3-disilabutane, 2,2,4,4-tetrachloro-2,4-disilapentane, 1,1,3,3-tetrachloro-1,3-disilapropane, 2,4-dichloro-2,4-dimethyl-2,4-disilapentane, 1,1,1,3,3,5,5,5-octachloro-1,3,5-trisilapentane, 2,2,4,6,6-pentachloro-4-methyl-2,4,6-trisilaheptane, and mixtures thereof.

7. The method of claim 5, wherein each of the first and second purge gases is selected from the group consisting of nitrogen, helium, argon and combinations thereof.

8. The method of claim 5, wherein the oxygen-containing source comprises at least one member selected from the group consisting of oxygen, peroxide, oxygen plasma, carbon dioxide plasma, carbon monoxide plasma, a composition comprising hydrogen and oxygen, a composition comprising hydrogen and ozone, a composition comprising carbon dioxide and oxygen, a composition comprising water and oxygen, a composition comprising nitrogen and oxygen, water vapor, water vapor plasma, a composition comprising water and ozone, hydrogen peroxide, ozone source, and combinations thereof.

9. The method according to claim 1, wherein step b further comprises bringing the reactor to a pressure ranging from 50 milliTorr (mTorr) to 760 Torr, and wherein the at least one halidocarbosilane precursor comprises at least one anchoring functionality and a passivating functionality comprising a Si-Me or Si—Cl group or both Si-Me and Si—Cl.

10. The method of claim 9, wherein the reactor temperature ranges from 700 to 850° C.

11. The method of claim 9, wherein the reactor pressure ranges from 50 milliTorr (mTorr) to 100 Torr.

* * * * *